US009584172B2

(12) United States Patent
Qiu et al.

(10) Patent No.: US 9,584,172 B2
(45) Date of Patent: *Feb. 28, 2017

(54) WIRELESS NETWORK RECEIVER

(71) Applicant: Texas Instruments Incorporated, Dallas, TX (US)

(72) Inventors: Wenxun Qiu, Allen, TX (US); Timothy Mark Schmidl, Dallas, TX (US); Minghua Fu, Plano, TX (US); Anuj Batra, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/821,264

(22) Filed: Aug. 7, 2015

(65) Prior Publication Data
US 2015/0349823 A1    Dec. 3, 2015

Related U.S. Application Data

(62) Division of application No. 14/294,879, filed on Jun. 3, 2014, now Pat. No. 9,136,813.

(60) Provisional application No. 61/908,551, filed on Nov. 25, 2013.

(51) Int. Cl.
| | | |
|---|---|---|
| H04L 27/08 | (2006.01) |
| H04B 1/12 | (2006.01) |
| H03G 3/30 | (2006.01) |
| H04B 17/20 | (2015.01) |
| H03M 3/04 | (2006.01) |
| H04B 7/08 | (2006.01) |
| H04L 27/14 | (2006.01) |

(52) U.S. Cl.
CPC .......... *H04B 1/123* (2013.01); *H03G 3/3078* (2013.01); *H03G 3/3089* (2013.01); *H04B 17/20* (2015.01); *H03M 3/042* (2013.01); *H04B 7/0811* (2013.01); *H04L 27/14* (2013.01)

(58) Field of Classification Search
CPC ...................................... H04B 1/123
USPC ....................................... 375/345
See application file for complete search history.

(56) References Cited

U.S. PATENT DOCUMENTS

| 6,252,865 B1 * | 6/2001 | Walton | H04W 72/1289 370/335 |
| 6,275,478 B1 * | 8/2001 | Tiedemann, Jr. | H04W 52/08 370/318 |
| 7,352,801 B2 * | 4/2008 | Ramakrishnan | H04B 7/0808 375/150 |
| 2003/0012313 A1 * | 1/2003 | Husted | H03G 5/165 375/345 |
| 2005/0078598 A1 * | 4/2005 | Batra | H04B 1/7163 370/206 |
| 2010/0158541 A1 * | 6/2010 | Tsunoda | H04B 10/6971 398/208 |
| 2010/0208840 A1 * | 8/2010 | Dore | H04L 27/265 375/295 |
| 2011/0194475 A1 * | 8/2011 | Kim | H04L 1/0053 370/311 |

(Continued)

*Primary Examiner* — Santiago Garcia
(74) *Attorney, Agent, or Firm* — John R. Pessetto; Charles A. Brill; Frank D. Cimino

(57) ABSTRACT

A wireless network receiver includes a detection module that uses preamble data in a data frame for signal processing functions and the detection module is configured to adjust the number of preamble data bits that are used based on the power of a received signal.

1 Claim, 2 Drawing Sheets

(56) References Cited

U.S. PATENT DOCUMENTS

| | | | | |
|---|---|---|---|---|
| 2012/0133815 A1* | 5/2012 | Nakanishi | ......... | H04B 10/1141 348/333.02 |
| 2012/0195328 A1* | 8/2012 | Otsuka | ................... | H04L 7/041 370/478 |
| 2012/0203560 A1* | 8/2012 | Poulsen | .................. | G06F 3/162 704/500 |
| 2013/0070696 A1* | 3/2013 | Tang | ................... | H04W 52/146 370/329 |
| 2013/0176864 A1* | 7/2013 | Quan | ............... | H04W 72/0473 370/245 |
| 2013/0332980 A1* | 12/2013 | Kobayashi | ............. | H04N 5/455 725/151 |
| 2014/0050157 A1* | 2/2014 | Korhonen | ........... | H04W 74/006 370/329 |
| 2014/0153632 A1* | 6/2014 | Malaga | .................. | H04L 7/042 375/239 |

* cited by examiner

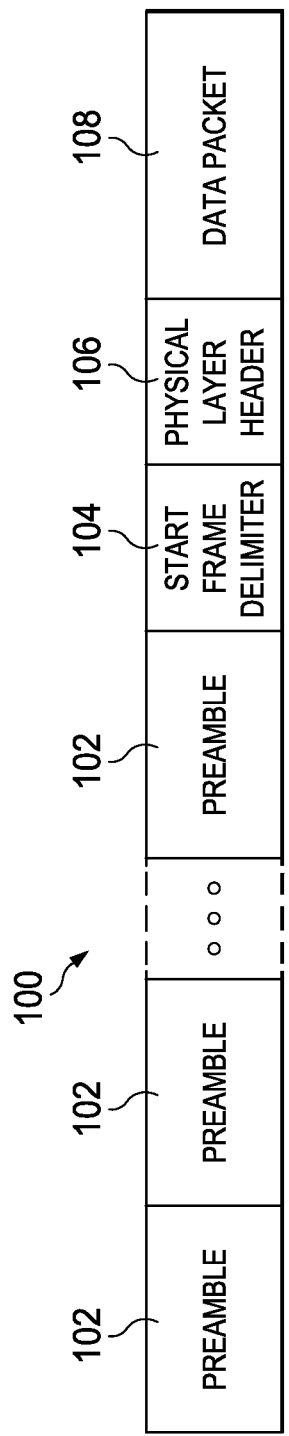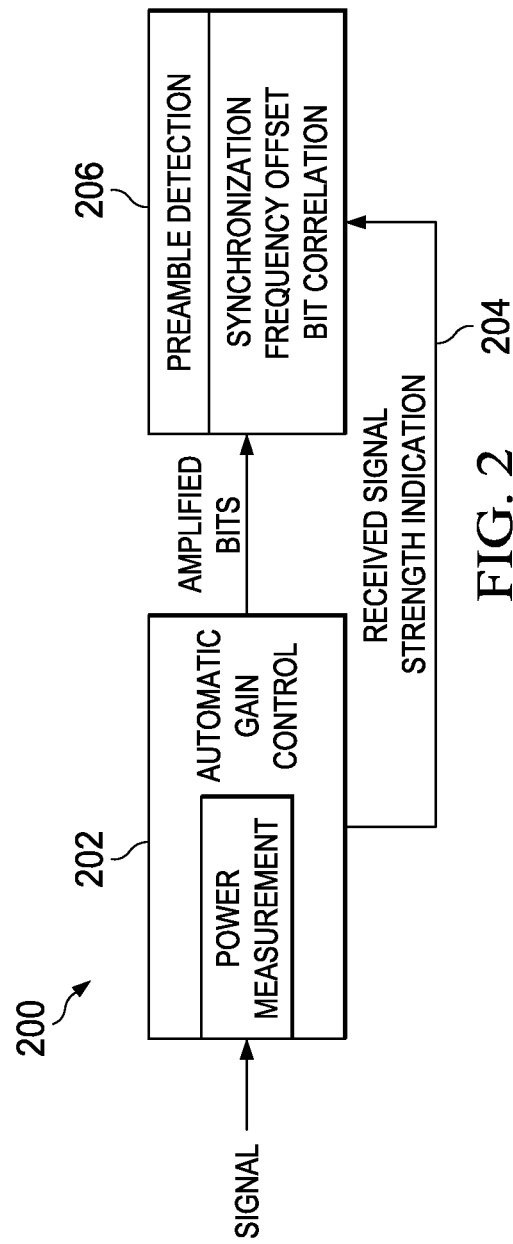

WIRELESS NETWORK RECEIVER

This application is a divisional of prior application Ser. No. 14/294,879, filed Jun. 3, 2014;

Which claims the benefit of U.S. Provisional Application No. 61/908,551 filed Nov. 25, 2013.

BACKGROUND

Utility companies (for example, electric, gas, and water) are increasingly implementing usage meters that can wirelessly transmit usage data. The wireless networks for utility companies are called Smart Utility Networks (SUN). There are multiple organizations developing standards for SUN. The Institute of Electrical and Electronics Engineers (IEEE) has a standard (IEEE 802.15.4g) for SUN. The Telecommunications Industry Association (TIA) also has a standard (TR-51) for SUN.

Meters on a customer's premises may wirelessly transmit data to a data collection point operated for a utility company. The data collection point may then be connected by fiber, copper wire, or wirelessly to a central office. Usage data may be hopped from meter to meter in a mesh configuration until it reaches the data collection point. A mesh configuration may be appropriate for an urban or suburban area with a high density of meters. Alternatively, usage data may be sent directly from each meter to the data collection point (star configuration). A star configuration may be appropriate for rural environments where the density of meters is so low that there may not be a convenient neighbor to use as an intermediate hop. There may also be mixtures of star and mesh configurations.

The Open Systems Interconnection (OSI) model for networks divides communications functionality into seven logical layers. The lowest layer, called the Physical Layer (PHY) defines the conversion between the representation of digital data and the corresponding signals transmitted over the physical communications channel, and also the structure of the data frames. There are multiple PHY's supported by the SUN standards. In particular, in one embodiment, all legacy devices in a SUN communicate using Frequency Shift Keying (FSK). Accordingly, for the particular embodiment, in a mesh configuration, all devices must be able to receive FSK modulated data with the specified data frame structure. There is a need for improved SUN receivers for receiving FSK modulated data.

BRIEF DESCRIPTION OF THE DRAWINGS

FIG. 1 is a block diagram of an example data frame.

FIG. 2 is a block diagram schematic of an example embodiment of a receiver for processing the data frame of FIG. 1.

DETAILED DESCRIPTION

Figure 3:
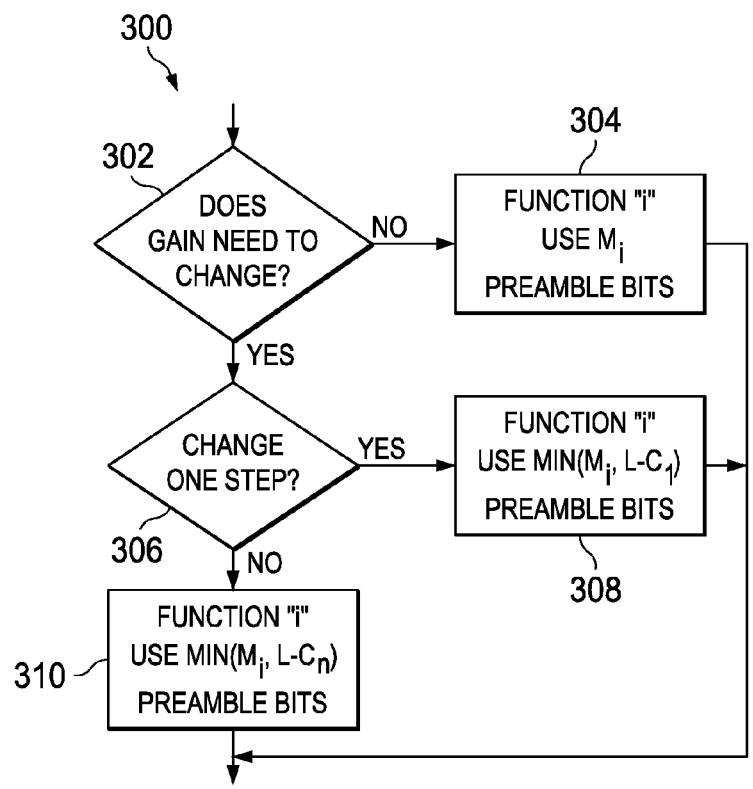
FIG. 3 is a flow chart of a method for operating the receiver of FIG. 2.

FIG. 1 illustrates a typical data frame structure specified by a PHY for FSK modulated data. The frame structure has a plurality of preamble bytes 102, followed by a Start Frame Delimiter (SFD) 104, followed by a Physical Layer Header (PHR) 106, followed by the data packet 108. The preamble bytes consist of the repetitive bit sequence 01010101. The SFD 104 is a pre-determined 16-bit or 32 bit sequence. The PHR 106 consists of 16 bits that contain information for decoding the data packet. The preamble bytes 102 are first used for signal power measurement and Automatic Gain Control (AGC) in the receiver. In addition, there are multiple signal processing functions (frequency offset estimation, bit synchronization, bit correlation) that must be performed before reading the data packet. Those signal processing functions also use the preamble bits.

Utility meter data is typically sent in short bursts. For example, a meter may send usage data every 15 minutes. A receiver in a mesh configuration may go into a standby or sleep mode between received bursts. A receiver may need some time to come out of a standby mode and adjust the amplifier gain. If the amplifier gain is not at the proper level, then the preamble bits may be corrupted and they cannot be used for the signal processing functions. Accordingly, the preamble bits are not used for frequency offset estimation, bit synchronization, and bit correlation until the amplifier gain is at the appropriate level.

During standby, the amplifier gain is set to the maximum gain to enable it to detect an incoming signal at the lowest specified power. The AGC module adjusts the amplifier gain in discrete steps, and each step has some constraints (for example, up to 50 dB adjustment per step). If the amplifier gain is at the maximum gain, and if a strong signal is received, the amplifier may need to adjust the gain downward multiple steps, and each step takes time. In prior art receivers, the receiver waits for the worst case AGC adjustment time before using the preamble bits for frequency offset estimation, bit synchronization. However, if a greater number of suitable preamble bits (bits received with the amplifier at the appropriate gain) could be used, then the accuracy of frequency offset adjustment, bit synchronization, and bit correlation would be improved. If the amplifier gain is at the maximum, and a low-power signal is received, then the amplifier gain does not need to change, but if the receiver waits for the worst case AGC adjustment time then some useful preamble bits are wasted. In the following discussion, instead of using the worst case AGC adjustment time, the receiver adaptively decides the number of preamble bits to use based on information from the AGC module.

FIG. 2 illustrates a receiver 200 with adaptive preamble detection. Receiver 200 has an AGC module 202 that measures the power of the incoming signal and adjusts the gain of an amplifier accordingly. A preamble detection module 206 uses the preamble bits to perform signal processing functions such as frequency offset estimation, bit synchronization, and bit correlation. The AGC module 202 sends a Received Signal Strength Indication (RSSI) signal 204 to the preamble detection module 206, indicating the strength of the incoming signal. For example, the RSSI signal may specify a gain index setting, or may specify how many AGC adjustment steps will be required to obtain the proper gain. In the following discussion, the number of AGC adjustment steps is used as an example, but other signal power information may be used instead. The preamble detection module 206 uses the RSSI signal to determine how long to wait before using preamble bits for frequency offset estimation, bit synchronization, and bit correlation. If for example, a low level signal is received, the RSSI signal may indicate that no AGC adjustment is necessary, and the preamble detection module 206 may start using the preamble bits immediately. Alternatively, if a strong signal is received, the RSSI signal may indicate that one or more AGC adjustment steps are required, and the preamble detection module 206 will wait an appropriate amount of time before using the preamble bits. Note that more preamble bits will be used for a weak signal, where more averaging of preamble bits is needed, and fewer preamble bits will be used for a strong signal, where averaging of preamble bits is less important.

Some utility meters, for example, water meters, may be battery powered, and they may be in relatively inaccessible locations, so it is important to preserve battery life. In addition, some utility meters may use processors with limited processing capability, to save on both processor cost and power consumption. On average, an adaptive receiver will use more preamble bits for the preamble detection module than a prior art receiver that always waits for a worst-case AGC adjustment time. Accordingly, on average, an adaptive receiver will use more processor instruction cycles and more battery power processing the additional preamble bits. An adaptive receiver may choose to process a maximum number of preamble bits, where the maximum number is less than the number of suitable bits, just to conserve power or just because of limited processing capability. Additionally, this choice may vary by function, so that for example, the maximum number of preamble bits used for frequency offset estimation may be different than the maximum number of preamble bits used for bit synchronization.

FIG. 3 illustrates an example method 300 to be performed by the preamble detection module 206. In method 300, "L" is the total number of preamble bits in the PHY specified frame structure. It is assumed that "n" AGC step changes can corrupt up to $C_n$ preamble bits. Each signal processing function "i" (in the preamble detection module) that processes preamble bits (frequency offset estimation, bit synchronization, bit correlation) may process up to $M_i$ preamble bits, where $M_i$<L (to conserve power). At step 302, if the amplifier gain does not need to change, then at step 304 each signal processing function "i" uses $M_i$ preamble bits. If, at step 302 the amplifier gain does need to change, then if, at step 306 the amplifier gain needs only one step of adjustment, then at step 308 each signal processing function "i" uses the minimum of ($M_i$, L-$C_1$) preamble bits. If, at step 306 the amplifier gain needs more than one step of adjustment ("n" steps of adjustment, where "n" is greater than one), then at step 310 each signal processing function "i" uses the minimum of ($M_i$, L-$C_n$) preamble bits.

Figure 4:
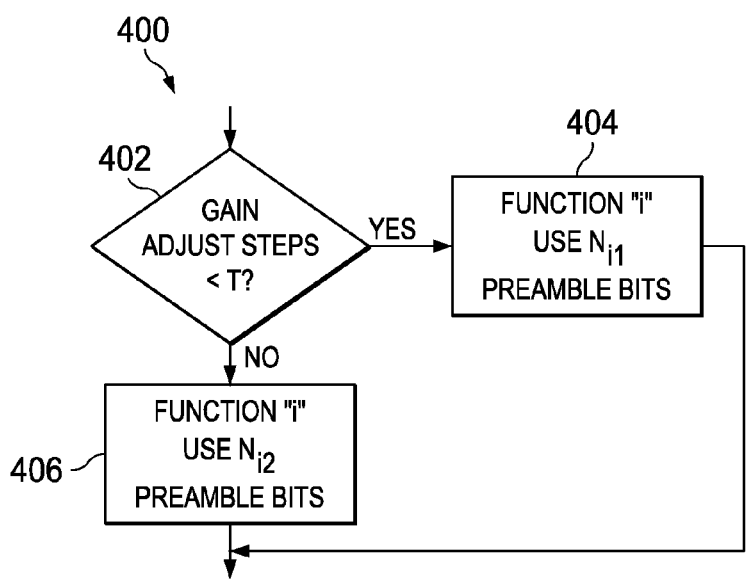
FIG. 4 is a flow chart of an alternative method for operating the receiver of FIG. 2.

FIG. 4 illustrates an alternative method 400 to be performed by the preamble detection module 206. In method 400, there is a predetermined threshold "T", where "T" is a number of steps of amplifier gain adjustment. For each signal processing function "i", there are two numbers ($N_{i1}$, $N_{i2}$) of preamble bits to be used, where $N_{i1}$ is greater than $N_{i2}$. At step 402, if the number of needed amplifier gain adjustment steps is less than "T", then at step 404 each signal processing function "i" uses $N_{i1}$ preamble bits. Otherwise, at step 406 each signal processing function "i" uses $N_{i2}$ preamble bits.

Note that a mesh configuration will be stable over a relatively long period of time, so that any one receiver will receive a signal from the same set of transmitters over a relatively long period of time. In an alternative embodiment, in addition to receiving the RSSI signal, the preamble detection module 206 keeps a history of the number of amplifier gain adjustment steps required by received signals. As one example, if all of the recently received signals require at least one amplifier gain adjustment step (that is, all the signals are relatively strong), then each signal processing function "i" uses $N_{i2}$ preamble bits.

In a specific example embodiment, if the needed amplifier gain change from the maximum gain is within 50 dB (one gain adjustment step or no gain adjustment needed), then at least one signal processing function "i" uses 32 preamble bits. If the needed amplifier gain change requires at least two steps of adjustment, then at least one signal processing function "i" uses 16 preamble bits.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A wireless network receiver, comprising:
   a preamble detection module that uses preamble bits in a data frame for signal processing functions; wherein the preamble detection module adjusts the number of preamble bits that are used in response to the power of a received signal;
   an automatic amplifier gain control module that measures the power of the received signal and sends power information to the preamble detection module;
   where the power information specifies a number of amplifier gain adjustment steps that will be required in response to the power of the received signal; and
   where the preamble detection module uses a first number of preamble bits for signal processing when the required number of gain adjustment steps is less than a predetermined threshold, and where the preamble detection module uses a second number of preamble bits for signal processing when the required number of gain adjustment steps is greater than the predetermined threshold.

* * * * *